(12) United States Patent
Wang et al.

(10) Patent No.: US 11,217,723 B2
(45) Date of Patent: Jan. 4, 2022

(54) FLEXIBLE DISPLAY SUBSTRATE AND METHOD FOR MANUFACTURING THE SAME, AND FLEXIBLE DISPLAY DEVICE

(71) Applicant: BOE Technology Group Co., Ltd., Beijing (CN)

(72) Inventors: Pinfan Wang, Beijing (CN); Shantao Chen, Beijing (CN); Shuai Zhang, Beijing (CN); Ming Liu, Beijing (CN); Qiuhua Meng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 73 days.

(21) Appl. No.: 16/712,075

(22) Filed: Dec. 12, 2019

(65) Prior Publication Data

US 2020/0227586 A1    Jul. 16, 2020

(30) Foreign Application Priority Data

Jan. 14, 2019 (CN) .......................... 201910046630.5

(51) Int. Cl.
*H01L 33/00* (2010.01)
*H01L 25/075* (2006.01)
*G06F 1/16* (2006.01)

(52) U.S. Cl.
CPC ........ *H01L 33/0095* (2013.01); *G06F 1/1652* (2013.01); *H01L 25/0753* (2013.01); *H01L 2933/0033* (2013.01)

(58) Field of Classification Search
CPC ............ H01L 33/0095; H01L 25/0753; H01L 2933/0033; H01L 2933/0016; G06F 1/1652; G09F 9/301
See application file for complete search history.

(56) References Cited

U.S. PATENT DOCUMENTS

| | | | |
|---|---|---|---|
| 2009/0174835 A1* | 7/2009 | Lee .................... | G02F 1/133512 349/46 |
| 2016/0029473 A1* | 1/2016 | Zang ................... | H01L 27/1218 361/749 |
| 2017/0110531 A1* | 4/2017 | Ko ....................... | H01L 51/0097 |
| 2017/0262022 A1* | 9/2017 | Choi ................... | G02B 5/3025 |
| 2019/0067575 A1* | 2/2019 | Li ........................ | H01L 51/0097 |
| 2019/0171058 A1* | 6/2019 | Shin ................... | G02F 1/133305 |
| 2019/0267357 A1* | 8/2019 | Iguchi ................. | H01L 25/0753 |
| 2020/0152842 A1* | 5/2020 | Park ...................... | G06F 1/1626 |

* cited by examiner

*Primary Examiner* — Kyoung Lee
(74) *Attorney, Agent, or Firm* — Muncy, Geissler, Olds and Lowe, P.C.

(57) ABSTRACT

The present disclosure provides a flexible display substrate, a method for manufacturing the same, and a flexible display device, and belongs to the technical field of display. Among them, the method for manufacturing a flexible display substrate includes: providing a carrier substrate; forming a flexible display substrate including a plurality of pre-cuts on the carrier substrate, with the plurality of pre-cuts exposing the carrier substrate; forming an inverted frustum structure on the carrier substrate at the plurality of pre-cuts, an orthogonal projection of a lower end surface of the inverted frustum structure on the carrier substrate is located within an orthogonal projection of an upper end surface of the inverted frustum structure on the carrier substrate; packaging the flexible display substrate; and peeling the flexible display substrate packaged from the carrier substrate.

20 Claims, 4 Drawing Sheets

FLEXIBLE DISPLAY SUBSTRATE AND METHOD FOR MANUFACTURING THE SAME, AND FLEXIBLE DISPLAY DEVICE

CROSS-REFERENCE TO RELATED APPLICATION

This application claims a priority to Chinese Patent Application No. 201910046630.5 filed on Jan. 14, 2019, the disclosures of which are incorporated in their entirety by reference herein.

TECHNICAL FIELD

The present disclosure relates to the field of display technology, in particular to a flexible display substrate, a method for manufacturing the flexible display substrate and a flexible display device.

BACKGROUND

With the development of display technology, a stretchable flexible display device has gradually become the hotspot of research and the focus of market. The stretchable flexible display device is a deformable, bendable display device made of a flexible material, and the size of the display device can also be increased and stretchable.

The stretchable flexible display device can be applied to different environments due to being freely bendable, folded, stretched, etc., thereby expanding the application range of the display device. In addition, the stretchable flexible display device has the advantages of being thin and light, small in size, low in power consumption, good in portability, etc., and thus can be applied to a wearable device.

SUMMARY

An embodiment of the present disclosure provides a technical solution as follows.

In one aspect, a method for manufacturing a flexible display substrate is provided, including: providing a carrier substrate; forming a flexible display substrate including a plurality of pre-cuts and a display functional layer on the carrier substrate, with the plurality of pre-cuts exposing the carrier substrate; forming an inverted frustum structure on the carrier substrate at the plurality of pre-cuts, an orthogonal projection of a lower end surface of the inverted frustum structure on the carrier substrate is located within an orthogonal projection of an upper end surface of the inverted frustum structure on the carrier substrate; packaging the flexible display substrate; and peeling the flexible display substrate packaged from the carrier substrate.

Further, the forming the flexible display substrate including the plurality of pre-cuts and the display functional layer on the carrier substrate includes: forming a flexible base on the carrier substrate; forming a display functional layer on the flexible base; etching the flexible base and the display functional layer to form the plurality of pre-cuts; and forming a light-emitting unit on the flexible base.

Further, after forming the plurality of pre-cuts, an orthogonal projection of the flexible base on the carrier substrate is located within an orthogonal projection of the display functional layer on the carrier substrate.

Further, the forming the inverted frustum structure on the carrier substrate at the plurality of pre-cuts includes: forming a negative photoresist layer at the plurality of pre-cuts; exposing the negative photoresist layer with a mask including a light-transmitting region and a non-light-transmitting region, to form a photoresist-reserved region and a photoresist-removed region; and developing the negative photoresist layer of the photoresist-reserved region to form the inverted frustum structure.

Further, the packaging the flexible display substrate includes: forming a thin-film packaging layer on the carrier substrate formed with the inverted frustum structure.

Further, the forming the thin-film packaging layer on the carrier substrate formed with the inverted frustum structure includes forming a first inorganic thin film on the carrier substrate formed with the inverted frustum structure.

Further, the forming the thin-film packaging layer on the carrier substrate formed with the inverted frustum structure further includes sequentially forming an organic thin film and a second inorganic thin film on the first inorganic thin film after the forming the first inorganic thin film on the carrier substrate formed with the inverted frustum structure.

Further, a thickness of the thin-film packaging layer at an edge of the upper end surface of the inverted frustum structure is less than a thickness of the thin-film packaging layer at a center of the upper end surface of the inverted frustum structure.

Further, a thickness of the negative photoresist is equal to a thickness of the thin-film packaging layer.

Further, the peeling the flexible display substrate packaged from the carrier substrate includes: peeling the packaged flexible display substrate from the carrier substrate by a laser lift-off.

An embodiment of the present disclosure further provides a flexible display substrate manufactured by the above method, in which the flexible display substrate includes a plurality of pre-cuts, the plurality of pre-cuts is a notches in the case that the flexible display substrate is not stretched, the plurality of pre-cuts become cavities formed by the notches in the case that the flexible display substrate is stretched, and a pore diameter of the cavity is greater than a pore diameter of the notch.

Further, a packaging layer of the flexible display substrate coats a side surface of the plurality of pre-cuts.

An embodiment of the present disclosure further provides a flexible display device including the flexible display substrate as described above.

BRIEF DESCRIPTION OF THE DRAWINGS

In order to illustrate the technical solutions of the present disclosure in a clearer manner, the drawings desired for the embodiments of the present disclosure will be briefly hereinafter briefly. Obviously, the following drawings merely relate to some embodiments of the present disclosure. Based on these drawings, a person skilled in the art may obtain the other drawings without any creative effort.

DETAILED DESCRIPTION

In order to make the technical problems to be solved, the technical solutions, and the advantages of the examples of the present disclosure, the present disclosure will be described hereinafter in conjunction with the drawings and specific examples.

A stretchable flexible display substrate has attracted attention in the field of display devices, and the stretchable flexible display substrate can be varied in size and shape, thereby making human life more colorful. In the production of a stretchable flexible display device of the related art, a flexible display substrate is first manufactured on a carrier substrate, and then a plurality of pre-cuts is formed on the flexible display substrate. Subsequently, the flexible display substrate is packaged, and the flexible display substrate is peeled from the carrier substrate, obtain a stretchable flexible display substrate. In a state where the flexible display substrate is not stretched, the plurality of pre-cuts is present in the form of notches; and in a state where the flexible display substrate is stretched, the plurality of pre-cuts is formed into cavities by the notches stretched.

The technical problem to be solved by the present disclosure is to provide a flexible display substrate, a method for manufacturing the sane, and a flexible display device, which can improve the yield rate of the flexible display substrate.

Figure 1:
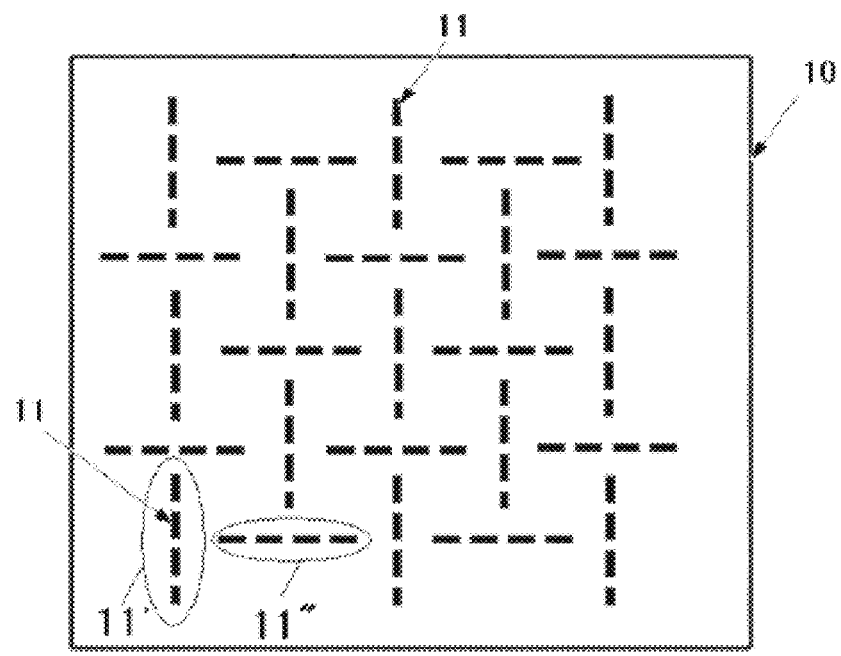
FIG. 1 is a plan schematic view showing a stretchable flexible display substrate when it is not stretched.
Figure 2:
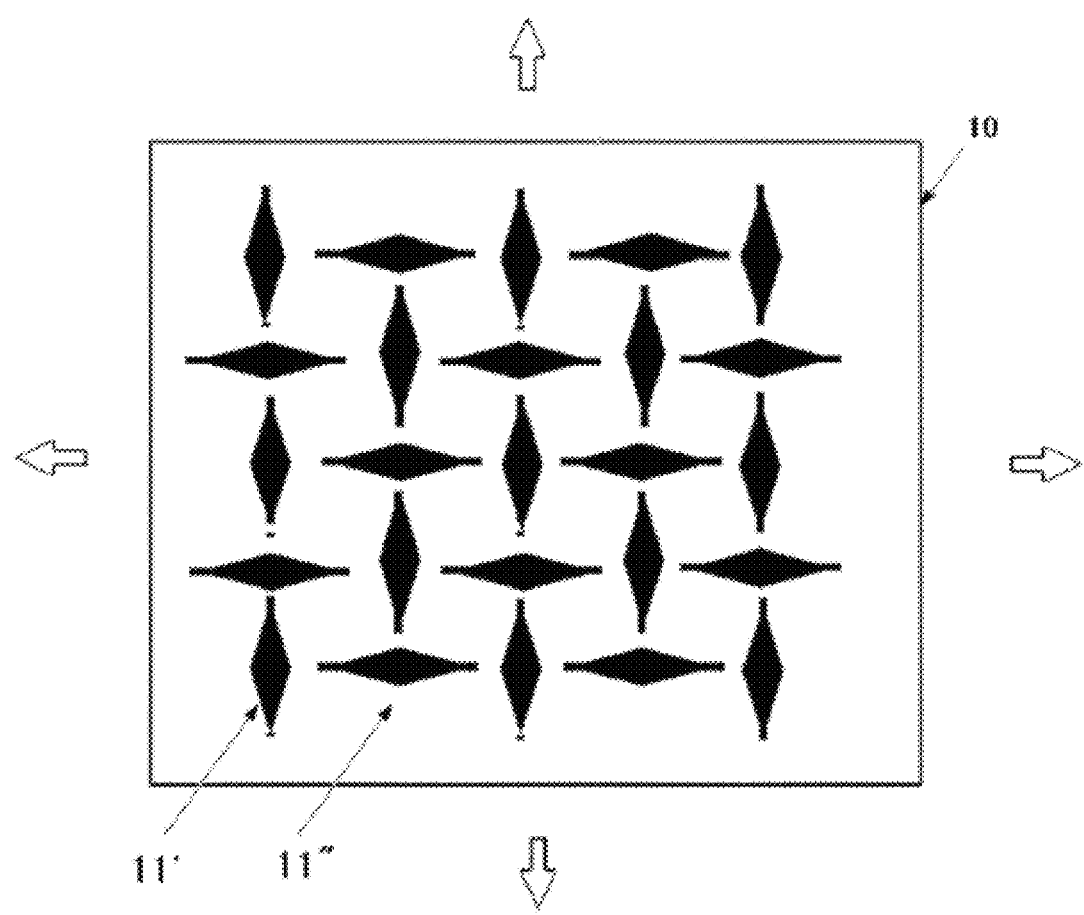
FIG. 2 is a plan schematic view showing a stretchable flexible display substrate when it is stretched.

FIG. 1 is a plan schematic view showing a stretchable flexible display substrate, and FIG. 2 is a schematic view showing a stretchable flexible display substrate when it is stretched. As shown in FIG. 1, the flexible display substrate includes a flexible base 10, the flexible base 10 is formed with the plurality of pre-cuts 11, and these pre-cuts 11 may be formed in the form of pre-cut sets, such as pre-cut sets 11' and 11". In a state where the flexible base 10 is not stretched, the pre-cuts 11 exist in the form of the notches as shown in FIG. 1; and in a state where the flexible base 10 (for example, in the direction of the arrow in FIG. 2) is stretched, each set of pre-cuts 11', 11" is formed into the cavity by the notch stretched, as shown in FIG. 2, in which a pore diameter of the cavity is greater than a pore diameter of the notch.

Figure 3:
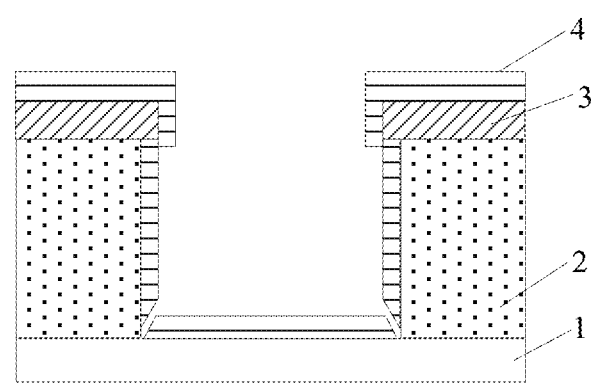
FIG. 3 is a sectional schematic view showing a stretchable flexible display substrate in the related art.

However, before the flexible display substrate is peeled from the carrier substrate, at the pre-cut, as shown in FIG. 3, the first inorganic thin film 4 in the thin-film packaging layer of the flexible display substrate is directly attached to the carrier substrate, relatively tightly bonded to the carrier substrate, and difficult to be peeled from the carrier substrate. Thus, when the flexible display substrate is peeled from the carrier substrate, it is easy to cause damage to the thin-film packaging layer and even other layers, and reduce the yield rate of the flexible display substrate.

Embodiments of the present disclosure are directed to the above problems, and provide a flexible display substrate, a method for manufacturing the same, and a flexible display device, which can improve the yield rate of the flexible display substrate.

An embodiment of the present disclosure provides a method for manufacturing a flexible display substrate, including: providing a carrier substrate; forming a flexible display substrate including a plurality of pre-cuts and a display functional layer on the carrier substrate, with the plurality of pre-cuts exposing the carrier substrate; forming an inverted frustum structure on the carrier substrate at the plurality of pre-cuts, an orthogonal projection of a lower end surface of the inverted frustum structure on the carrier substrate is located within an orthogonal projection of an upper end surface of the inverted frustum structure on the carrier substrate; packaging the flexible display substrate; and peeling the flexible display substrate packaged from the carrier substrate.

In this embodiment, an inverted frustum structure is formed on the carrier substrate at the plurality of pre-cuts, so that when the flexible display substrate is subsequently packaged and the inorganic thin film is deposited on the flexible display substrate, the thickness of the inorganic thin film is relatively small at the edge of the inverted frustum structure. Then, when the packaged flexible display substrate is peeled from the carrier substrate by a laser lift-off technology, the inverted frustum structure will be partially ablated and generate gas, and the inverted frustum structure will expand due to heating. The inorganic thin film will be subjected to gas and expansion pressure, and thus breakage will occur in the weak point at the edge of the inverted frustum structure, so that the peeling of the flexible display substrate can be easily performed. Thus, this can avoid damaging the thin-film packaging layer and even other layers, and improves the yield rate of the flexible display substrate.

Further, the forming the flexible display substrate including the plurality of pre-cuts and the display functional layer on the carrier substrate includes: forming a flexible base on the carrier substrate; forming a display functional layer on the flexible base; etching the flexible base and the display functional layer to form the plurality of pre-cuts; and forming a light-emitting unit on the flexible base.

Further, after forming the plurality of pre-cuts, an orthogonal projection of the flexible base on the carrier substrate is located within an orthogonal projection of the display functional layer on the carrier substrate.

Among them, the display functional layer includes a thin-film transistor, a signal line and an insulating film layer, etc., and an orthogonal projection of the flexible base on the carrier substrate is located within an orthogonal projection of the display functional layer on the carrier substrate, thereby being capable of forming an inverted frustum structure at an edge of the interface between the display functional layer and the flexible base. Thus, after forming the first inorganic thin film, a thickness of the first inorganic thin film at the inverted frustum structure is relatively thin. When the packaged flexible display substrate is peeled from the carrier substrate, the weak point at the inverted frustum structure is prone to breakage, which contributes to completing the peeling of the flexible display substrate.

Further, the forming the inverted frustum structure on the carrier substrate at the plurality of pre-cuts includes: forming a negative photoresist layer at the plurality of pre-cuts; exposing the negative photoresist layer with a mask including a light-transmitting region and a non-light-transmitting region, to form a photoresist-reserved region and a photoresist-removed region; and developing the negative photoresist layer of the photoresist-reserved region to form the inverted frustum structure.

The exposed region of the negative photoresist is reserved after development, and the unexposed region is removed after development, while the light intensity received by the negative photoresist decreases from top to bottom. Thus, after development, the reserved portion of the negative photoresist is capable of forming a plurality of mutually independent inverted frustum structures at the pre-cuts.

Further, the packaging the flexible display substrate includes: forming a thin-film packaging layer on the carrier substrate formed with the inverted frustum structure.

Further, a thickness of the first inorganic thin film at an edge of the upper end surface of the inverted frustum structure is less than a thickness of the thin-film packaging layer at a center of the upper end surface of the inverted frustum structure. Due to the structural characteristics of the inverted frustum structure, a thickness of the first inorganic thin film at the upper end edge of the inverted frustum structure is less than a thickness of the thin-film packaging layer at a center of the upper end surface of the inverted frustum structure, that is, the upper end edge of the inverted frustum structure is the weak point of the thin-film packaging layer.

The forming the thin-film packaging layer on the carrier substrate formed with the inverted frustum structure includes forming a first inorganic thin film on the carrier substrate formed with the inverted frustum structure.

Further, the forming the thin-film packaging layer on the carrier substrate formed with the inverted frustum structure further includes sequentially forming an organic thin film and a second inorganic thin film on the first inorganic thin film after the forming the first inorganic thin film on the carrier substrate formed with the inverted frustum structure.

In order to ensure the packaging performance of the flexible display substrate, the packaging layer of the flexible display substrate includes a first inorganic thin film, an organic thin film and a second inorganic thin film that are sequentially stacked, in which the first inorganic thin film and the second inorganic thin film have better compactness and the ability to block water and oxygen, and the organic thin film is capable of relieving the stress of the first inorganic thin film and the second inorganic thin film.

Further, the peeling the flexible display substrate packaged from the carrier substrate includes: peeling the packaged flexible display substrate from the carrier substrate by the laser lift-off. When the laser lift-off is performed, the inverted frustum structure will be partially ablated under the action of the laser to generate gas, and the heat generated by the laser will cause the inverted frustum structure to expand due to heating, which will have an upward impact on the thin-film packaging layer. The thin-film packaging layer is subjected to gas and expansion pressures, and the weak point at the edge of the inverted frustum structure will be broken, so that the thin-film packaging layer at the pre-cuts can be separated from the thin-film packaging layer of other regions. Further, the peeling of the flexible display substrate can be completed relatively easily, and the thin-film packaging layer and other display functional layers are not damaged due to the force, thereby being capable of ensuring the yield rate of the flexible display substrate.

The method for manufacturing the flexible display substrate of the present disclosure will be described in detail below in conjunction with the accompanying drawings and specific embodiments.

The method for manufacturing the flexible display substrate of this embodiment includes the following steps.

Figure 4:
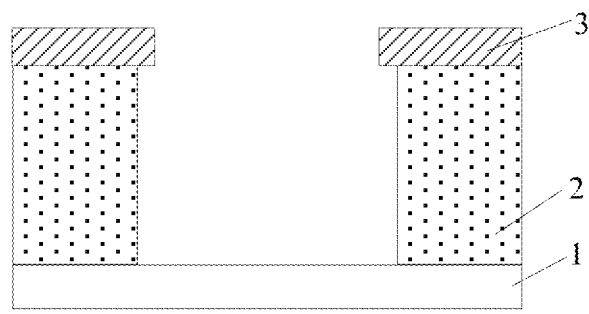
FIG. 4 is a schematic view showing a stretchable flexible display substrate after forming a plurality of pre-cuts according to some embodiments of the present disclosure.

Step 1: as shown in FIG. 4, a carrier substrate 1 is provided, a flexible base 2 is formed on the carrier substrate 1, a display functional layer 3 and an anode are formed on the flexible base 2, and a plurality of pre-cuts is formed by a punching process, followed by forming a light-emitting layer and a cathode.

Specifically, the carrier substrate 1 is a rigid substrate, and specifically may be a glass substrate or a quartz substrate.

Specifically, the flexible base 2 may be made of polyimide.

The display functional layer 3 includes a display functional layer, such as a gate insulating layer, a gate metal layer pattern, an active layer, an interlayer insulating layer, and a source/drain metal layer pattern, and the process for forming the display functional layer in the related art is a relatively mature manufacturing process, which will not be described here again.

An overcoat covering the display functional layer is formed, and an anode and a pixel definition layer are formed on the overcoat, in which the pixel definition layer defines a plurality of pixel regions.

Thereafter, a plurality of pre-cuts can be manufactured by a punching process. At the pre-cuts, the flexible base 2 and the display functional layer 3 of the flexible display substrate are removed, thereby exposing the carrier substrate 1.

Thereafter, vapor deposition of the light-emitting layer and the cathode is performed, in which the light-emitting layer and the cathode are not formed at the pre-cuts. The anode, the cathode, and the light-emitting layer between the anode and the cathode constitute a light-emitting unit, and the light-emitting unit is capable of emitting light in the driving of the display functional layer.

Figure 5:
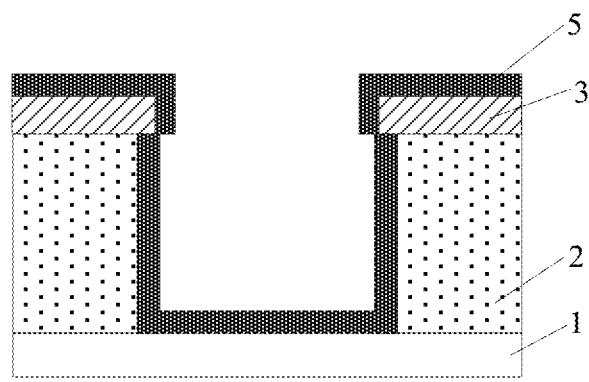
FIG. 5 is a schematic view showing a stretchable flexible display substrate after coating a negative photoresist embodiment according to some embodiments of the present disclosure.

Step 2: as shown in FIG. 5, one negative photoresist layer 5 is applied at the plurality of pre-cuts.

The negative photoresist 5 has a certain thickness, optionally equal to the thickness of the subsequently formed thin-film packaging layer 4, or slightly greater than the thickness of the subsequently formed thin-film packaging layer 4, or slightly less than the thickness of the subsequently formed thin-film packaging layer 4.

Figure 6:
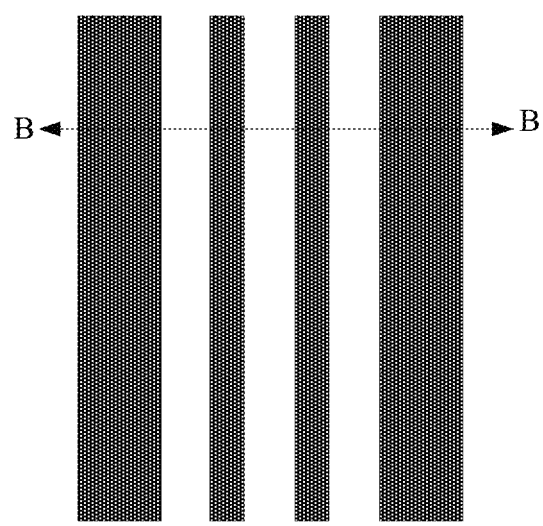
FIG. 6 is a top schematic view showing a stretchable flexible display substrate after forming an inverted frustum structure according to some embodiments of the present disclosure.
Figure 7:
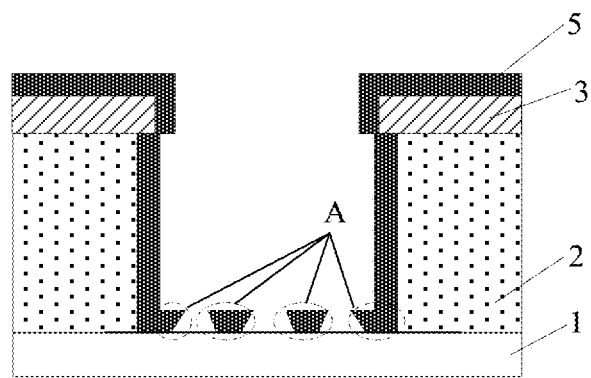
FIG. 7 is a sectional schematic view taken along line BB of FIG. 6.

Step 3: as shown in FIG. 6 and FIG. 7, the negative photoresist 5 is exposed, and a plurality of mutually independent inverted frustum structures is formed after development, in which FIG. 6 is a top view showing the flexible display substrate, and FIG. 7 is a schematic sectional view showing the BB position of FIG. 6.

Specifically, the negative photoresist 5 is exposed by a mask including a plurality of light-transmitting regions corresponding to the plurality of pre-cuts. The exposed region of the negative photoresist 5 is reserved after development, and the unexposed region is removed after development, while the light intensity received by the negative photoresist 5 decreases from top to bottom. Thus, after development, an orthogonal projection of a lower end surface of the reserved portion of the negative photoresist 5 on the carrier substrate is located within an orthogonal projection of the upper end surface of the inverted frustum structure on the carrier substrate, thereby forming a plurality of mutually independent inverted frustum structures A at the pre-cuts.

As shown in FIG. 7, in a specific example, the inverted frustum structure A at the edge of the pre-cut is connected to the negative photoresist 5 coating the side surface of the flexible base 2. Of course, the inverted frustum structure A at the edge of the pre-cut can be also separated from the negative photoresist 5 coating the side surface of the flexible base 2.

Figure 8:
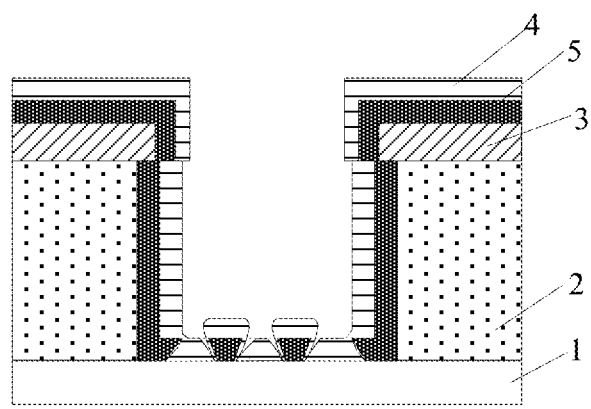
FIG. 8 is a schematic view showing a stretchable flexible display substrate after forming the first inorganic thin film according to some embodiments of the present disclosure.

Step 4: a thin-film packaging layer 4 is formed on the carrier substrate 1 subjected to the step 3; optionally, as shown in FIG. 8, the thin-film packaging layer 4 includes a first inorganic thin film.

Specifically, when the flexible display substrate is packaged, the first inorganic thin film 4 is first formed; and the first inorganic thin film may be an oxide, a nitride or an oxynitride compound.

Among them, the thin-film packaging layer 4 of the flexible display substrate coats a side surface of the plurality of pre-cuts, to protect the display functional layer at the plurality of pre-cuts.

As shown in FIG. 8, at the plurality of pre-cuts, the thin-film packaging layer 4 is in contact with the carrier substrate 1 and the inverted frustum structure A. Due to the structural characteristics of the inverted frustum structure A, after depositing the first inorganic thin film 4, the thickness of the first inorganic thin film 4 at the edge of the upper end surface of the inverted frustum structure A is relatively small and less than the thickness of the thin-film packaging layer 4 at a center of the upper end surface of the inverted frustum structure A.

If the height of the inverted frustum structure A is greater than the thickness of the thin-film packaging layer 4, the thin-film packaging layer 4 is also broken at the edge of the inverted frustum structure A, so that the thin-film packaging layer 4 at the pre-cuts will be separated from the thin-film packaging layer 4 of other regions.

Even if the height of the inverted frustum structure A is not greater than the thickness of the thin-film packaging layer 4, the thin-film packaging layer 4 may have a plurality of weak points at the edge of the upper end surface of the inverted frustum structure A.

In order to ensure the packaging performance of the flexible display substrate, the thin-film packaging layer 4 further includes an organic thin film and a second inorganic thin film. Specifically, after forming the first inorganic thin film, an organic thin film and a second inorganic thin film may be formed, in which the inorganic thin film may be made of an oxide, a nitride or an oxynitride; and the first inorganic thin film, the organic thin film and the second inorganic thin film form the thin-film packaging layer 4 of the flexible display substrate.

Step 5: the packaged flexible display substrate is peeled from the carrier substrate 1 by the laser lift-off.

Figure 9:
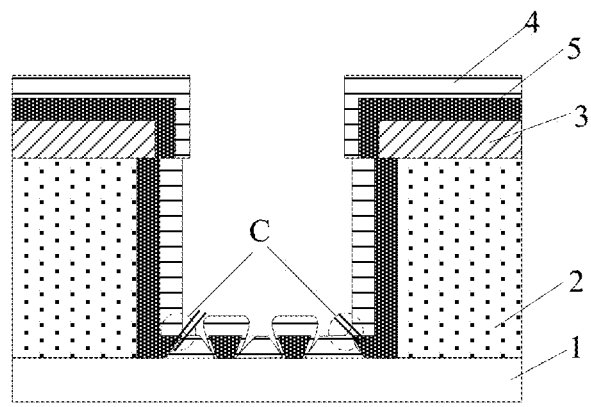
FIG. 9 is a schematic view showing the breakage of the first inorganic thin film when peeling the flexible display substrate from the carrier substrate according to some embodiments of the present disclosure.

When the laser lift-off (LLO) is performed, the inverted frustum structure A will be partially ablated under the action of the laser to generate gas, and the heat generated by the laser will cause the inverted frustum structure A to expand due to heating, which will have an upward impact on the thin-film packaging layer 4, as shown in FIG. 9. The thin-film packaging layer 4 is subjected to gas and expansion pressures, and the weak point at the edge of the upper end surface of the inverted frustum structure A will be broken, so that the thin-film packaging layer 4 at the pre-cuts can be separated from the thin-film packaging layer 4 of other regions. Further, the peeling of the flexible display substrate can be completed relatively easily, and the thin-film packaging layer and other display functional layers are not damaged due to the force, thereby being capable of ensuring the yield rate of the flexible display substrate.

In this embodiment, an inverted frustum structure is formed on the carrier substrate at the plurality of pre-cuts, so that when the flexible display substrate is subsequently packaged and the inorganic thin film is deposited on the flexible display substrate, the thickness of the inorganic thin film is relatively small at the edge of the inverted frustum structure. Then, when the packaged flexible display substrate is peeled from the carrier substrate by the laser lift-off technology, the inverted frustum structure will be partially ablated and generate gas, and the inverted frustum structure will expand due to heating. The inorganic thin film will be subjected to gas and expansion pressure, and thus breakage will occur in the weak point at the edge of the inverted frustum structure, so that the peeling of the flexible display substrate can be easily performed. Thus, this can avoid damaging the thin-film packaging layer and even other layers, and improves the yield rate of the flexible display substrate.

An embodiment of the present disclosure further provides a flexible display substrate manufactured by the above method for manufacturing the flexible display substrate, in which the flexible display substrate includes a plurality of pre-cuts, the plurality of pre-cuts is the notches in the case that the flexible display substrate is not stretched, the plurality of pre-cuts become the cavities formed by the notches in the case that the flexible display substrate is stretched, and a pore diameter of the cavity is greater than a pore diameter of the notch.

Further, the thin-film packaging layer 4 of the flexible display substrate coats a side surface of the plurality of pre-cuts, so that the packaging layer can protect the display functional layer at the plurality of pre-cuts, thereby ensuring the yield rate of the flexible display substrate.

An embodiment of the present disclosure further provides a flexible display device including the flexible display substrate as described above.

The flexible display device may be any product or component having a display function, such as a television, a display, a digital photo frame, a mobile phone, a tablet computer, etc., in which the display device further includes a flexible circuit board, a printed circuit board, and a backplane.

Embodiments of the present disclosure have the following advantageous effects.

In the above solution, an inverted frustum structure is formed on the carrier substrate at the plurality of pre-cuts, so that when the flexible display substrate is subsequently packaged and the inorganic thin film is deposited on the flexible display substrate, the thickness of the inorganic thin film is relatively small at the edge of the inverted frustum structure. Then, when the packaged flexible display substrate is peeled from the carrier substrate by the laser lift-off technology, the inverted frustum structure will be partially ablated and generate gas, and the inverted frustum structure will expand due to heating. The inorganic thin film will be subjected to gas and expansion pressure, and thus breakage will occur in the weak point at the edge of the inverted frustum structure, so that the peeling of the flexible display substrate can be easily performed. Thus, this can avoid damaging the thin-film packaging layer and even other layers, and improves the yield rate of the flexible display substrate.

In the method embodiments of the present disclosure, the serial numbers of the steps cannot be used to define the sequence of the steps. As for one skilled in the art, the changes in the order of steps without paying creative work also fall within the scope of the present disclosure.

Unless otherwise defined, technical terms or scientific terms used herein have the normal meaning commonly understood by one skilled in the art in the field of the present disclosure. The words "first", "second", and the like used in the present disclosure does not denote any order, quantity, or importance, but rather merely serves to distinguish different components. The "including", "comprising", and the like used in the present disclosure means that the element or item appeared in front of the word encompasses the element or item and their equivalents listed after the word, and does exclude other elements or items. The word "connected" or "connecting" and the like are not limited to physical or mechanical connections, but may include electrical connections, whether direct or indirect. "On", "under", "left", "right" and the like are only used to represent relative positional relationships, and when the absolute position of the described object is changed, the relative positional relationship may also be changed, accordingly.

It will be understood that when an element, such as a layer, film, region, or substrate, is referred to as being "on" or "under" another element, the element may be directly "on" or "under" another element, or there may be an intermediate element.

The above descriptions are alternative embodiments of the present disclosure. It should be noted that one skilled in the art would make several improvements and substitutions without departing from the principles of the present disclosure. These improvements and modifications should also be regarded as the protection scope of the present disclosure.

What is claimed is:

1. A method for manufacturing a flexible display substrate, comprising:
   providing a carrier substrate;
   forming a flexible display substrate comprising a plurality of pre-cuts and a display functional layer on the carrier substrate, with the plurality of pre-cuts exposing the carrier substrate;
   forming an inverted frustum structure on the carrier substrate in the pre-cut, an orthogonal projection of a lower end surface of the inverted frustum structure on the carrier substrate is located within an orthogonal projection of an upper end surface of the inverted frustum structure on the carrier substrate;
   packaging the flexible display substrate; and
   peeling the flexible display substrate packaged from the carrier substrate.

2. The method for manufacturing the flexible display substrate of claim 1, wherein the forming the flexible display substrate comprising the plurality of pre-cuts and the display functional layer on the carrier substrate comprises:
   forming a flexible base on the carrier substrate;
   forming a display functional layer on the flexible base;
   etching the flexible base and the display functional layer to form the plurality of pre-cuts; and
   forming a light-emitting unit on the flexible base.

3. The method for manufacturing the flexible display substrate of claim 1, wherein after forming the plurality of pre-cuts, an orthogonal projection of the flexible base on the carrier substrate is located within an orthogonal projection of the display functional layer on the carrier substrate.

4. The method for manufacturing the flexible display substrate of claim 1, wherein the forming the inverted frustum structure on the carrier substrate at the plurality of pre-cuts comprises:
   forming a negative photoresist layer at the plurality of pre-cuts;
   exposing the negative photoresist layer with a mask comprising a light-transmitting region and a non-light-transmitting region, to form a photoresist-reserved region and a photoresist-removed region; and
   developing the negative photoresist layer of the photoresist-reserved region to form the inverted frustum structure.

5. The method for manufacturing the flexible display substrate of claim 4, wherein the packaging the flexible display substrate comprises:
   forming a thin-film packaging layer on the carrier substrate formed with the inverted frustum structure.

6. The method for manufacturing the flexible display substrate of claim 5, wherein the forming the thin-film packaging layer on the carrier substrate formed with the inverted frustum structure comprises:
   forming a first inorganic thin film on the carrier substrate formed with the inverted frustum structure.

7. The method for manufacturing the flexible display substrate of claim 6, wherein the forming the thin-film packaging layer on the carrier substrate formed with the inverted frustum structure further comprises:
   forming an organic thin film and a second inorganic thin film sequentially on the first inorganic thin film after the forming the first inorganic thin film on the carrier substrate formed with the inverted frustum structure.

8. The method for manufacturing the flexible display substrate of claim 5, wherein a thickness of the thin-film packaging layer at an edge of the upper end surface of the inverted frustum structure is less than a thickness of the thin-film packaging layer at a center of the upper end surface of the inverted frustum structure.

9. The method for manufacturing the flexible display substrate of claim 5, wherein a thickness of the negative photoresist is equal to a thickness of the thin-film packaging layer.

10. The method for manufacturing the flexible display substrate of claim 1, wherein the peeling the flexible display substrate packaged from the carrier substrate comprises:
    peeling the flexible display substrate packaged from the carrier substrate by a laser lift-off.

11. A flexible display substrate manufactured by the method according to claim 1, wherein the flexible display substrate comprises the plurality of pre-cuts, the plurality of pre-cuts is notches in the case that the flexible display substrate is not stretched, the plurality of pre-cuts becomes cavities formed by the notches stretched in the case that the flexible display substrate is stretched, and a pore diameter of the cavity is greater than a pore diameter of the notch.

12. The flexible display substrate of claim 11, wherein a packaging layer of the flexible display substrate coats a side surface of the plurality of pre-cuts.

13. The flexible display substrate of claim 11, wherein the forming the flexible display substrate comprising the plurality of pre-cuts and the display functional layer on the carrier substrate comprises:
    forming a flexible base on the carrier substrate;
    forming a display functional layer on the flexible base;
    etching the flexible base and the display functional layer to form the plurality of pre-cuts; and
    forming a light-emitting unit on the flexible base.

14. The flexible display substrate of claim 11, wherein after forming the plurality of pre-cuts, an orthogonal projection of the flexible base on the carrier substrate is located within an orthogonal projection of the display functional layer on the carrier substrate.

15. The flexible display substrate of claim 11, wherein the forming the inverted frustum structure on the carrier substrate at the plurality of pre-cuts comprises:
    forming a negative photoresist layer at the plurality of pre-cuts;

exposing the negative photoresist layer with a mask comprising a light-transmitting region and a non-light-transmitting region, to form a photoresist-reserved region and a photoresist-removed region; and developing the negative photoresist layer of the photoresist-reserved region to form the inverted frustum structure.

16. The flexible display substrate of claim 15, wherein the packaging the flexible display substrate comprises:

forming a thin-film packaging layer on the carrier substrate formed with the inverted frustum structure.

17. The flexible display substrate of claim 16, wherein the forming the thin-film packaging layer on the carrier substrate formed with the inverted frustum structure comprises forming a first inorganic thin film on the carrier substrate formed with the inverted frustum structure.

18. The flexible display substrate of claim 17, wherein the forming the thin-film packaging layer on the carrier substrate formed with the inverted frustum structure further comprises sequentially forming an organic thin film and a second inorganic thin film on the first inorganic thin film after the forming the first inorganic thin film on the carrier substrate formed with the inverted frustum structure.

19. The flexible display substrate of claim 16, wherein a thickness of the thin-film packaging layer at an edge of the upper end surface of the inverted frustum structure is less than a thickness of the thin-film packaging layer at a center of the upper end surface of the inverted frustum structure.

20. A flexible display device comprising the flexible display substrate of claim 11.

* * * * *